United States Patent
Wang

(10) Patent No.: US 11,515,185 B2
(45) Date of Patent: *Nov. 29, 2022

(54) AUTOMATED WAFER MONITORING

(71) Applicant: Taiwan Semiconductor Manufacturing Co., Ltd., Hsinchu (TW)

(72) Inventor: Kuo-Hung Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/308,777

(22) Filed: May 5, 2021

(65) Prior Publication Data

US 2021/0257237 A1   Aug. 19, 2021

Related U.S. Application Data

(63) Continuation of application No. 16/539,299, filed on Aug. 13, 2019, now Pat. No. 11,004,711.

(60) Provisional application No. 62/719,556, filed on Aug. 17, 2018.

(51) Int. Cl.
*H01L 21/67* (2006.01)
*H01L 21/683* (2006.01)
*H01L 21/68* (2006.01)

(52) U.S. Cl.
CPC .. *H01L 21/67259* (2013.01); *H01L 21/67253* (2013.01); *H01L 21/681* (2013.01); *H01L 21/6831* (2013.01)

(58) Field of Classification Search
CPC .................................................. H01L 21/681
See application file for complete search history.

(56) References Cited

U.S. PATENT DOCUMENTS

| | | | | |
|---|---|---|---|---|
| 5,748,435 A | * | 5/1998 | Parkhe | G03F 7/70708 361/234 |
| 6,126,382 A | | 10/2000 | Scales et al. | |
| 6,544,379 B2 | | 4/2003 | Tamura et al. | |
| 8,278,224 B1 | * | 10/2012 | Mui | H01L 21/02274 438/778 |
| 11,004,711 B2 | * | 5/2021 | Wang | H01L 21/67259 |
| 2002/0101596 A1 | * | 8/2002 | Park | H01L 21/681 356/614 |
| 2008/0280453 A1 | * | 11/2008 | Koelmel | H01L 21/6838 438/758 |
| 2015/0219479 A1 | | 8/2015 | Adderly et al. | |

FOREIGN PATENT DOCUMENTS

EP  0821084 A1  1/1998
JP  2004335825 A  11/2004

* cited by examiner

*Primary Examiner* — Lynn E Schwenning
(74) *Attorney, Agent, or Firm* — Duane Morris LLP

(57) ABSTRACT

In an embodiment, a system includes: a chuck; multiple groove conduits arranged around a circumference of a wafer position on the chuck; a gas source in fluid communication with the multiple groove conduits; and a flow monitor configured to determine an amount of gas flow from the gas source to an individual one of the multiple groove conduits.

20 Claims, 10 Drawing Sheets

AUTOMATED WAFER MONITORING

CROSS-REFERENCE TO RELATED APPLICATION

This application is a continuation application of U.S. patent application Ser. No. 16/539,299, filed Aug. 13, 2019 which claims priority to U.S. Provisional Patent Application No. 62/719,556, filed on Aug. 17, 2018, each of which are incorporated by reference herein in their entireties.

BACKGROUND

Modern manufacturing processes are typically highly automated to manipulate materials and devices and create a finished product. Quality control and maintenance processes often rely on human skill, knowledge and expertise for inspection of the manufactured product both during manufacture and as a finished product.

Typical processing of wafers (e.g., semiconductor workpieces, semiconductor devices, or semiconductor materials) may employ no specific inspection technique for wafer placement on a chuck aside from a manual inspection. This manual inspection may require opening a semiconductor processing chamber in which the wafer is placed on the chuck. Such a manual inspection may also require taking the semiconductor processing chamber offline. Such inspection techniques require large amounts of overhead, but still fail to produce satisfactory results. Therefore, conventional inspection techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
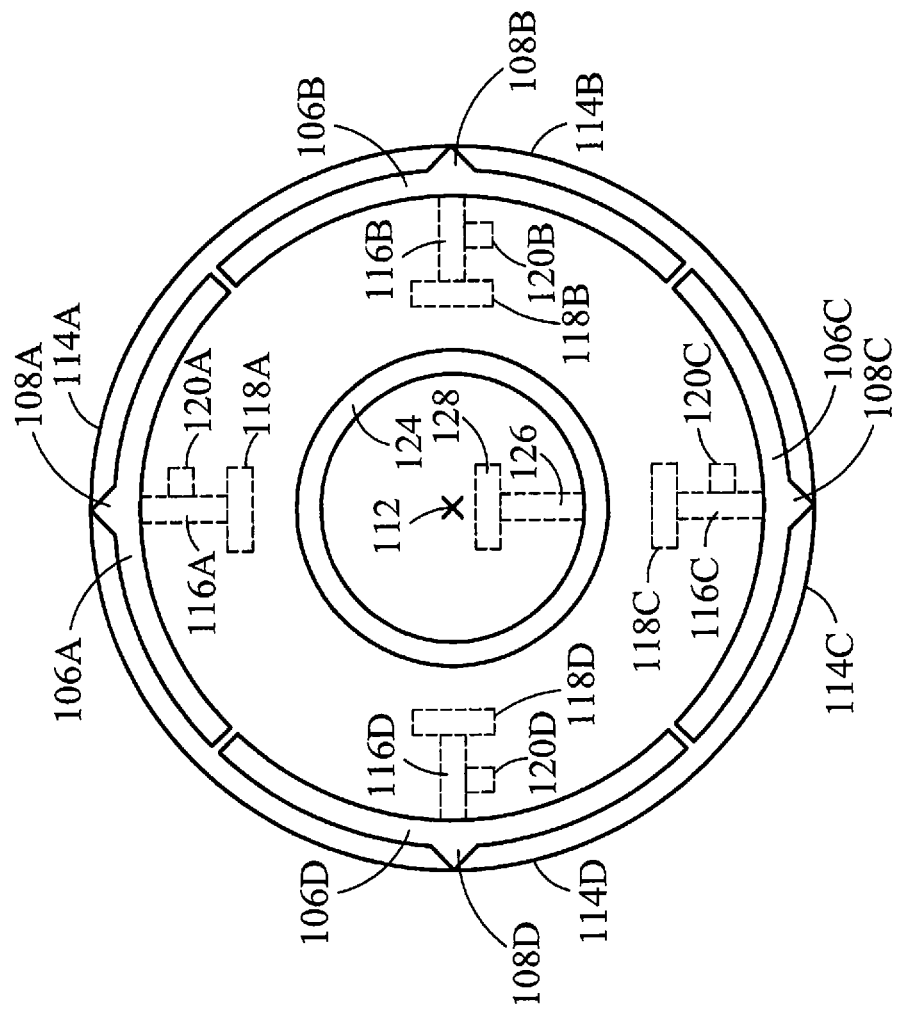
FIG. 1 is a conceptual plan view illustration of a monitoring chuck system, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to utilizing a monitoring chuck system to monitor individual directional grooves to determine whether a wafer is properly aligned or positioned on a chuck at a wafer position. The chuck may be an electrostatic chuck. The monitoring chuck system may include a perimeter of directional grooves adjacent to the circumference of the wafer when the wafer rests on the chuck. Each of the directional grooves may include a conduit to a gas source. Also, each groove may be referred to as a directional groove as each groove may be disposed in a particular angular orientation (e.g., direction) relative to a center of the wafer position and/or center of the monitoring chuck. In certain embodiments, a groove may be referred to as a groove conduit to reference a structure of both a groove and associated conduit. A flow monitor may determine the flow of gas from the gas source and out of each groove. An increase in the flow of gas or a greater flow of gas relative to the other grooves or other baseline (e.g., threshold) may be utilized as an indicia of wafer offset. The gas may be helium gas or argon gas and may also be utilized to cool the wafer during semiconductor processing. Wafer offset may refer to a directional offset from a nominal position for the wafer (e.g., the wafer position) as the wafer rests on the chuck. Such a wafer position may be predetermined from a robot, such as a predetermined setting for placement of the wafer by the robot. In certain embodiments, the wafer position may be physically indicated (e.g., via a physical line or other indicator on the monitoring chuck) for ease of identification of the wafer position, such as for a visual inspection. The grooves may include a tapered portion, such as a triangular portion, which may or may not vary (e.g., decrease) in area with distance away from the center of the wafer position or monitoring chuck. Accordingly, the tapered portion may be utilized for a fine determination of a degree of wafer offset in a particular direction. In virtue of the tapering, an amount of gas flow indicative of the degree of wafer offset may increase as the wafer is offset along the tapered portion of a groove. There may be multiple directional grooves, with each directional groove representative of an offset direction. For example, there may be four directional grooves, one respectively for a top offset, a bottom offset, a left side offset and a bottom side offset. The chamber with the monitoring chuck system may also include a transparent lid from which the monitoring chuck system and the monitored wafer may be visually inspected. In various embodiments, the monitoring chuck system may be part of a chamber utilized for wafer processing, such as for dry etching.

FIG. 1 is a conceptual plan view illustration of a monitoring chuck system 102, in accordance with some embodiments. The solid lines are visible from a plan view while the dotted lines indicate underlying structure that may not be visible from the plan view but affect the structure visible in the plan view. A monitoring chuck 104 may include multiple grooves 106A, 106B, 106C, 106D, which are open portions along a top surface of the monitoring chuck 104. Each of the grooves may be directional in that they may be used, respectively, to monitor for an offset in a direction (e.g., angular or other orientation with reference to a wafer position aligned with the circumference of the monitoring chuck 104) by monitoring for an amount of escaping gas. Also, each groove may include a tapered portion 108A, 108B, 108C, 108D, which is an area of a groove that increases with distance closer to the center 112 of the monitoring chuck 104 and/or wafer position. The center 112 of the monitoring chuck 104 may also be a point that an axis of rotation for the monitoring chuck may pass through. The center is illustrated with an X to indicate that it is also the location of the axis of rotation coming into and/or out of the plan view of FIG. 1.

As illustrated, a top groove 106A may monitor for an offset from the top edge 114A of the monitoring chuck 104. A bottom groove 106B may monitor for an offset from the bottom edge 114B of the monitoring chuck 104. A right groove 106C may monitor for an offset from a right edge 114C of the monitoring chuck 104. Also, a left groove 106D may monitor for an offset from a left edge 114D of the monitoring chuck 104. Each groove 106A, 106B, 106C, 106D may be structured with a conduit 116A, 116B, 116C, 116D from which a respective gas source 118A, 118B, 118C, 118D may supply a gas to an outer surface of the monitoring chuck 104 in order to, for example, cool a wafer on the monitoring chuck 104. Each respective gas source 118A, 118B, 118C, 118D may be embedded within a lower part of the monitoring chuck system 102. Also, each respective gas source 118A, 118B, 118C, 118D may include at least one pump and/or valve in order to calibrate the supply of gas to a respective conduit 116A, 116B, 116C, 116D.

Respectively, along a conduit 116A, 116B, 116C, 116D, there may be a flow monitor 120A, 120B, 120C, 120D that monitors for an amount of gas flow from the gas source 118A, 118B, 118C, 118D and out of the groove 106A, 106B, 106C, 106D. The flow monitor may be implemented as, for example, a flow monitor used to measure a linear, nonlinear, mass or volumetric flow rate of the gas. Examples of flow monitors may include, for example, rotameters, mass gas flow meters, ultrasonic flow meters, turbine flow meters, paddlewheel flow meters, and the like. As will be discussed further below, each flow monitor 120A, 120B, 120C, 120D may be operatively coupled with a processor that may determine whether the amount of gas flow along the conduit is beyond a threshold to warrant remediation.

In addition, there may be a central annulus 124 closer to the center 112 than any of the grooves 106A, 106B, 106C, 106D. The central annulus 124 may also be connected via a conduit 126 to a gas source 128. In certain embodiments, the central annulus 124 may also be utilized to provide cooling gas to the wafer on the monitoring chuck 104 but toward the center of the monitoring chuck (and/or wafer position) relative to the grooves. Also, the grooves 106A, 106B, 106C, 106D may differ from the central annulus 124 in that the grooves may have an associated flow monitor 120A, 120B, 120C, 120D. In certain embodiments, the gas sources 118A, 118B, 118C, 118D associated with a groove 106A, 106B, 106C, 106D may be a single gas source or may be a combined gas source such that each groove 106A, 106B, 106C, 106D may not be associated with different gas sources but that certain grooves may be associated with a same gas source. Also, in particular embodiments, all gas sources 118A, 118B, 118C, 118D, 128 may be connected as a single gas source.

Figure 2A:
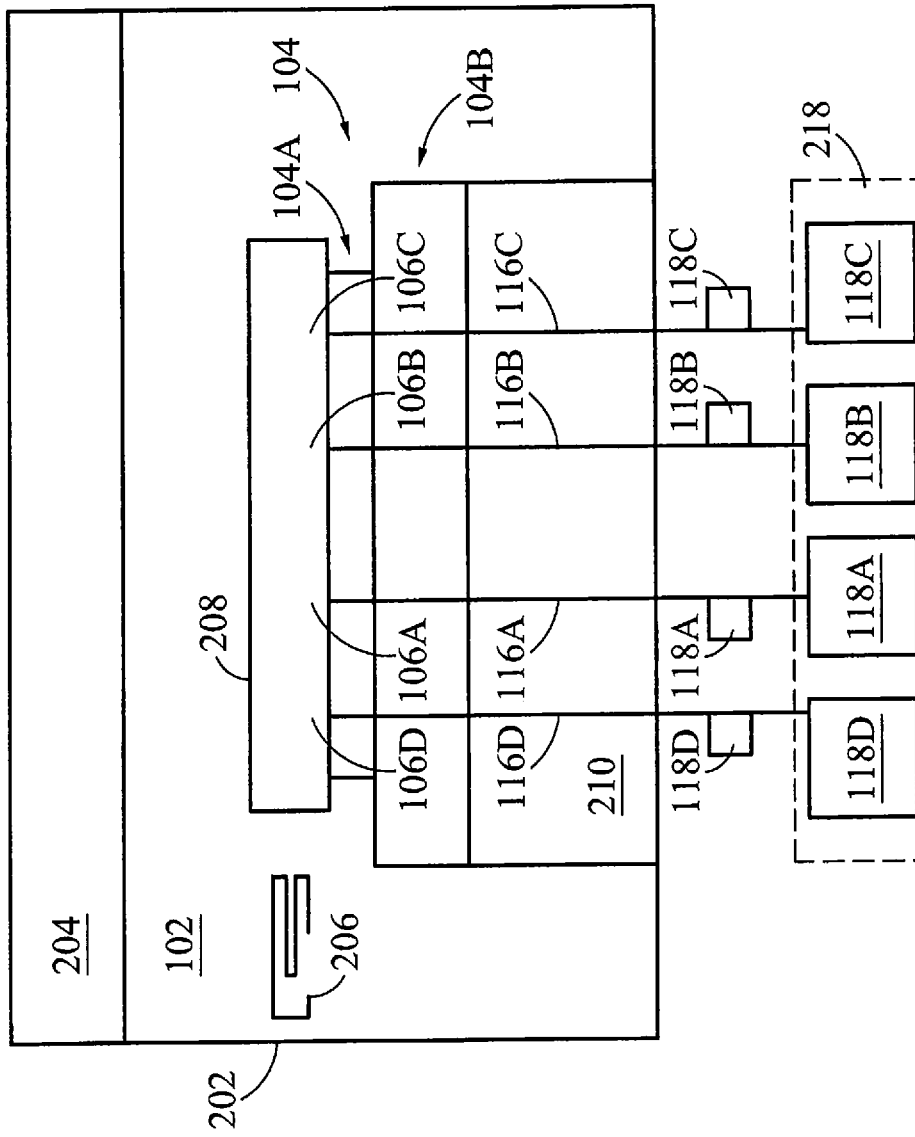
FIG. 2A is a conceptual side view of the monitoring chuck system, in accordance with some embodiments.

FIG. 2A is a conceptual side view of the monitoring chuck system 102, in accordance with some embodiments. The monitoring chuck system 102 may be enclosed within a semiconductor processing chamber housing 202. The monitoring chuck system 102 may include a transparent ceiling 204 from which other components of the monitoring chuck system 102 may be visible from outside of the semiconductor processing chamber housing 202.

In addition, the monitoring chuck system 102 may include a robot 206 to move the wafer 208 to and from the monitoring chuck 104. The robot 206 may be a programmable mechanical arm to grasp, hold, and manipulate objects. The robot 206 may include any type of effector or gripper used for grasping or holding an object, such as a wafer, by the robot 206. For example, the robot 206 may include at least one of: a pressure gripper (e.g., gripping by applying pressure to an object, such as with a pincer type motion), an envelope gripper (e.g., gripping by surrounding an object to be manipulated), a vacuum gripper (e.g., gripping by suction force), and a magnetic gripper (e.g., gripping by use of electromagnetic forces).

The wafer 208 may be placed, by the robot 206, on the monitoring chuck 104. The wafer 208 in FIG. 2A is illustrated as offset from the monitoring chuck for ease of illustration, but may rest directly on the monitoring chuck 104. Under the wafer 208, the grooves 106A, 106B, 106C, 106D may supply gas from a respective gas source 118A, 118B, 118C, 118D to cool the wafer 208 during semiconductor processing within the semiconductor processing chamber housing 202 and using the monitoring chuck system 102. In certain embodiments, the monitoring chuck 104 may be an electrostatic chuck that may utilize electrostatic forces to attract the wafer 208 to the surface of the monitoring chuck 104. For example, the monitoring chuck 104 may adhere to the wafer 208 by the electrostatic force of the monitoring chuck 104 as well as the weight of the wafer 208 by gravitational forces. The monitoring chuck 104 may include an upper portion 104A and a lower portion 104B. The upper portion 104A may be smaller than the lower portion 104B as the lower portion may include more circuitry and/or other components (e.g., cooling systems for the electrostatic chuck) than at the upper portion 104A. The upper portion 104A may be constructed to better conduct the electrostatic charge or forces in order to adhere the wafer 208 to the monitoring chuck 104. The monitoring chuck 104 may rest on a platform 210.

As illustrated, each groove 106A, 106B, 106C, 106D, may be in fluid communication with a respective conduit 116A, 116B, 116C, 116D. With each respective conduit, there may be a flow monitor 120A, 120B, 120C, 120D that monitors for an amount of gas flow from the gas source 118A, 118B, 118C, 118D and out of the groove 106A, 106B, 106C, 106D. For simplicity of discussion and illustration, the central annulus and related structures are not illustrated in FIG. 2A. In certain embodiments, the gas sources 118A, 118B, 118C, 118D associated with a groove 106A, 106B, 106C, 106D may be from a single gas source 218 or may be a combined gas source such that each groove 106A, 106B, 106C, 106D may not be associated with different gas sources but that certain grooves may be associated with a same gas source.

Figure 2B:
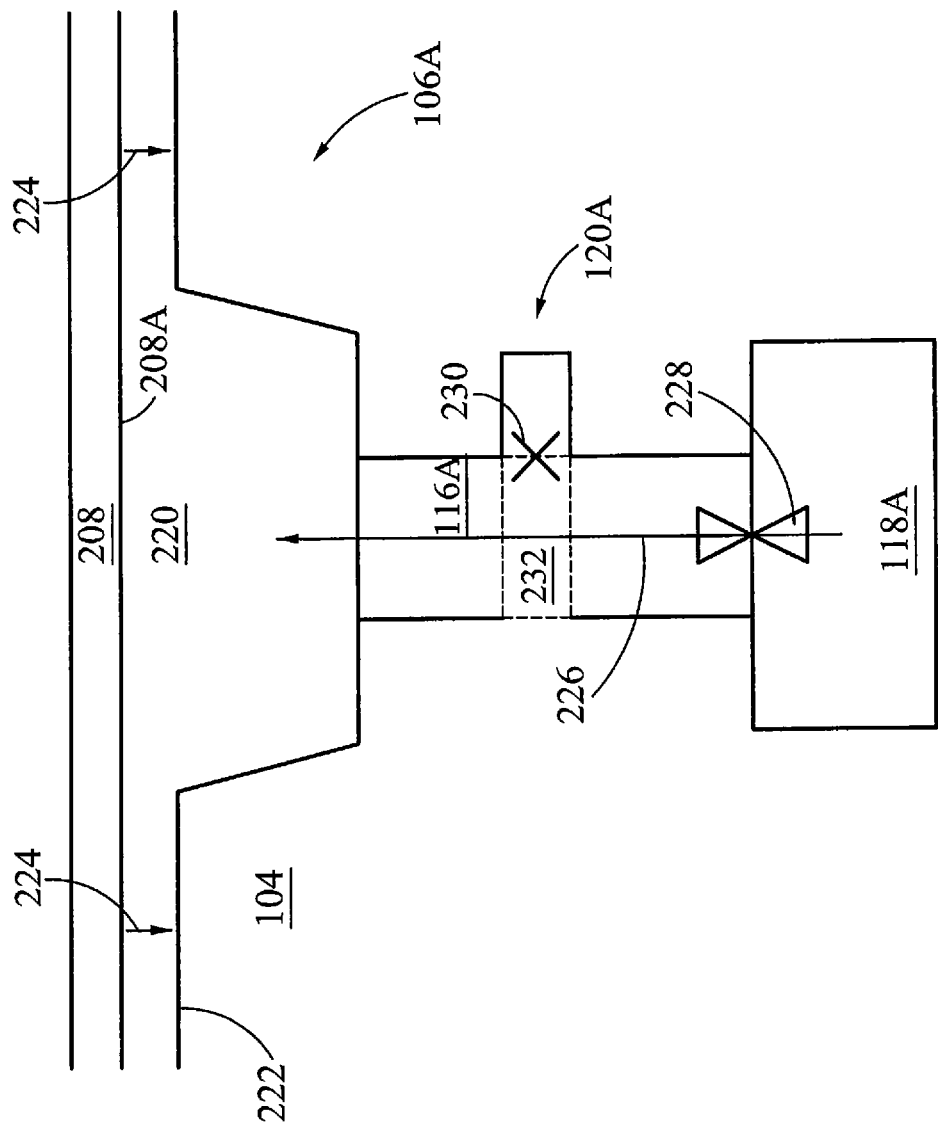
FIG. 2B is a cross sectional illustration of a groove, in accordance with some embodiments.

FIG. 2B is a cross sectional illustration of the groove 106A, in accordance with some embodiments. Although a particular groove 106A is illustrated in FIG. 2B, the features of FIG. 2B may be applicable generally to any groove, such as grooves 106B, 106C, and/or 106D, discussed above. Returning to FIG. 2B, the groove 106A may include an opening 220 along an upper surface 222 of the monitoring chuck 104. The wafer 208 may be configured to lie on the upper surface 222. As noted above, the wafer 208 may be adhered to the monitoring chuck 104 by electrostatic forces 224 produced by the monitoring chuck 104. Simultaneously, gas 226 from the gas source 118A may be passed to the opening 220 to cool a backside 208A of the wafer 208.

The gas 226 may pass through the conduit 116A and be regulated by a valve or pump 228 as it leaves the gas source 118A to the conduit 116A. For example, the valve or pump 228 may define an aperture or interface between the gas source 118A and the conduit 116A that controls an amount of gas 226 that may exit from the gas source 118A into the conduit 116A. More specifically, the size of the aperture or interface may be directly related to the amount of gas 226 that may exit from the gas source 118A into the conduit 116A.

Also, there may be a flow monitor 120A along the conduit 116A that monitors for an amount of gas flow from the gas source 118A and out of the groove 106A. The flow monitor 120A may be implemented as, for example, a flow monitor used to measure a linear, nonlinear, mass or volumetric flow rate of the gas. Examples of flow monitors may include, for example, rotameters, mass gas flow meters, ultrasonic flow meters, turbine flow meters, paddlewheel flow meters, and the like. For example, the flow monitor 120A may be a paddlewheel 230 flow meter where the rotational speed of the paddlewheel 230 may be taken as indicative of the amount of gas flow. The paddlewheel 230 may be partially within a detector portion 232 of the flow monitor 120A which may house other, or alternative, sensory equipment to monitor the flow of gas through the conduit 116A. Also, the flow monitor may produce sensor data for determination of whether the amount of gas flow along the conduit is indicative of a threshold event (e.g., passing a threshold) to warrant remediation, as will be discussed further below.

Figure 3:
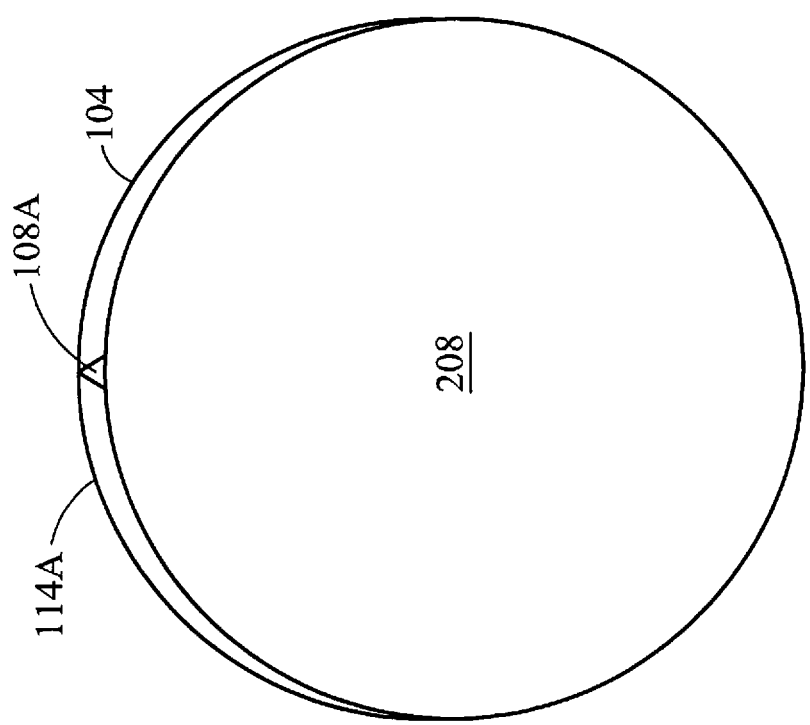
FIG. 3 illustrates an offset wafer that exposes a tip of a groove, in accordance with some embodiment.

FIG. 3 illustrates a plan view of the wafer 208 when offset in a manner that exposes a tip of the groove 106A, in accordance with some embodiments. More specifically, the tip may be part of the tapered portion 108A of a groove that may be exposed by the wafer 208 when the wafer is offset. As noted above, the monitoring chuck 104 may include multiple grooves, including a groove that the tapered portion 108A is part of. Each of the grooves may be directional in that they may be used, respectively, to monitor for an offset by monitoring for an amount of escaping gas. For example, the groove that the tapered portion 108A is part of may be a top groove to monitor for an offset from a nominal position relative to the top edge 114A of the monitoring chuck 104. Although the illustrated embodiment infers that the wafer 208 is to be aligned with the edges of the monitoring chuck 104 at a nominal wafer position, in various embodiments the wafer 208 may be aligned, rather, in various nominal wafer position on the monitoring chuck 104 that are offset from (e.g., not along) the edge of a monitoring chuck. For example, the wafer 208 at a wafer position may be offset from an edge of the monitoring chuck 104 by a set distance, such that the wafer 208 is still laterally surrounded by the monitoring chuck 104 but within a set position relative to the edge of the monitoring chuck 104. Further discussion and illustrations of wafer positions are provided below.

As noted above, a wafer offset (e.g., an offset of the wafer 208) may refer to a directional offset from a nominal position for the wafer 208 (e.g., a wafer position) as the wafer 208 rests on the monitoring chuck 104. Also, the tapered portion 108A of the groove may vary (e.g., decrease) in area with distance away from the center of the monitoring chuck 104 and/or wafer position. Accordingly, the tapered portion may be utilized for a fine determination of a degree of wafer offset in a particular direction.

Figure 4A:
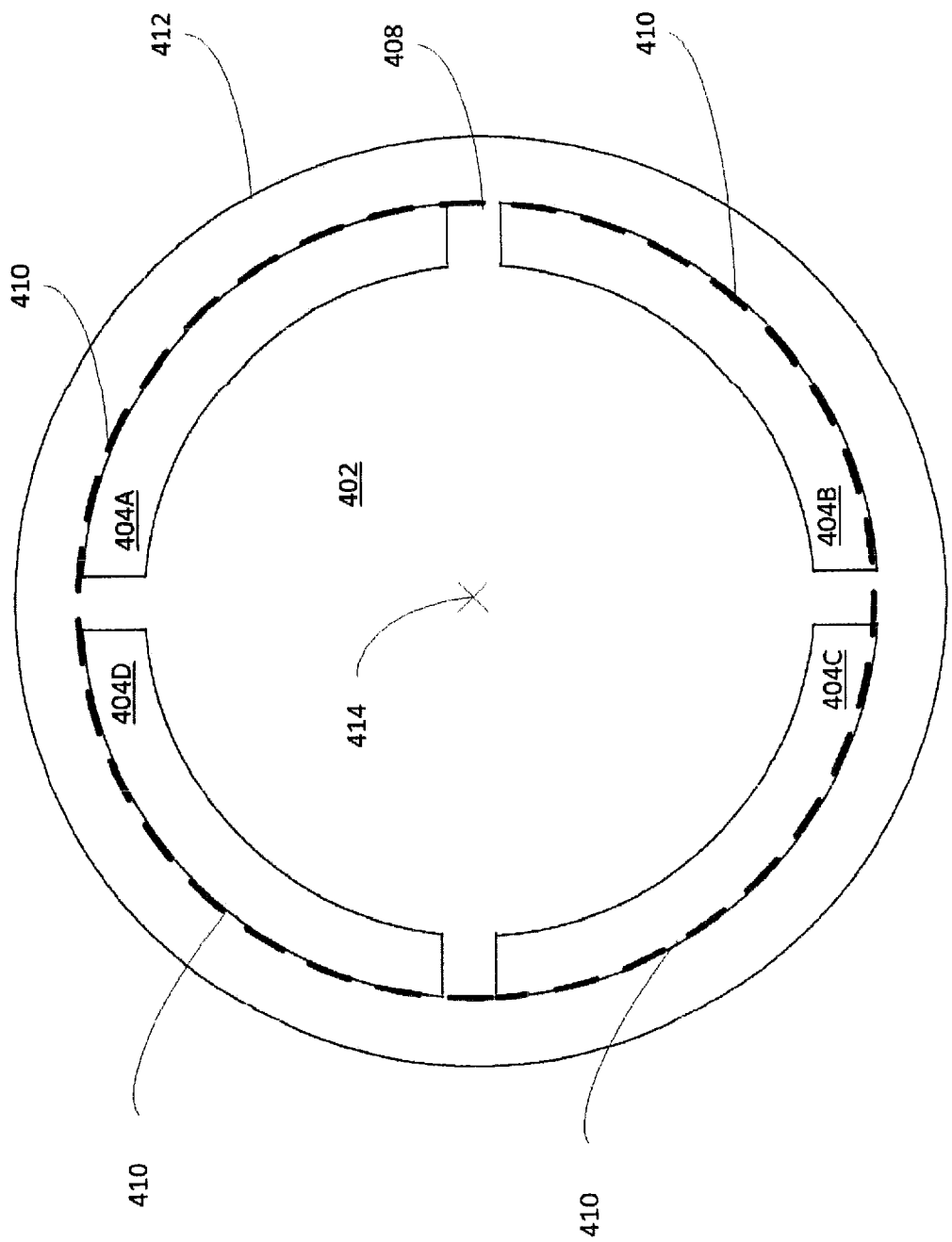
FIG. 4A is a plan view of a monitoring chuck with quadrant based grooves, in accordance with some embodiments.

FIG. 4A is a plan view of a monitoring chuck 402 with quadrant based grooves 404A, 404B, 404C, 404D without tapering, in accordance with some embodiments. The quadrant based grooves 404A, 404B, 404C, 404D may be utilized to determine whether a wafer (not illustrated) resting on the monitoring chuck 402 along a wafer position 408 is offset from the wafer position 408. The wafer position 408 is illustrated with dotted lines overlaying the monitoring chuck 402. As noted above, the wafer position 408 may be a nominal position for the wafer to rest on the monitoring chuck 402. As illustrated, the wafer position 408 may be aligned with an outer edge 410 of the grooves 404A, 404B, 404C, 404D. Also, the wafer position 408 may be offset from an outer edge 412 of the monitoring chuck 402. Although the wafer position is described as being aligned with a particular edge of the monitoring chuck 402, in certain embodiments the wafer position may be in a different orientation relative to a center 414 through an axis of rotation of the monitoring chuck 402. For example, the wafer position in other embodiments may be between a circumference along the outer edge 412 of the monitoring chuck 402 and a circumference along the outer edge 410 of the grooves 404A, 404B, 404C, 404D. In certain embodiments, the wafer position 408 may be a predetermined setting for placement of the wafer by a robot. In various embodiments, the wafer position 408 may be physically indicated (e.g., via a physical line or other indicator on the monitoring chuck 402) for ease of identification of the wafer position 408 in a visual inspection.

A wafer offset from the wafer position 408 may correspond to an amount of exposure of the quadrant based grooves 404A, 404B, 404C, 404D. The amount of exposure of the quadrant based grooves 404A, 404B, 404C, 404D may be directly related to an amount of gas that may be released from the grooves 404A, 404B, 404C, 404D. The amount of gas released from the grooves 404A, 404B, 404C, 404D may be monitored by a flow monitor (not illustrated). The flow monitor may produce sensor data that may be analyzed to characterize the wafer offset. For example, sensor data that indicates that the first groove 404A is releasing more gas (e.g., releasing gas at a greater rate) than the other grooves 404B, 404C, 404D may indicate that the wafer is offset from the wafer position 408 by exposing more of the first groove 404A than the other grooves 404B, 404C, 404D. As another example, sensor data that indicates that the second groove 404C is releasing less gas (e.g., releasing gas at a lower rate) than the other grooves 404B, 404C, 404D may indicate that the wafer is offset from the wafer position 408 by exposing more of the first groove 404A than the other grooves 404B, 404C, 404D and not exposing more of the second groove 404C than the other grooves 404B, 404C, 404D.

Figure 4B:
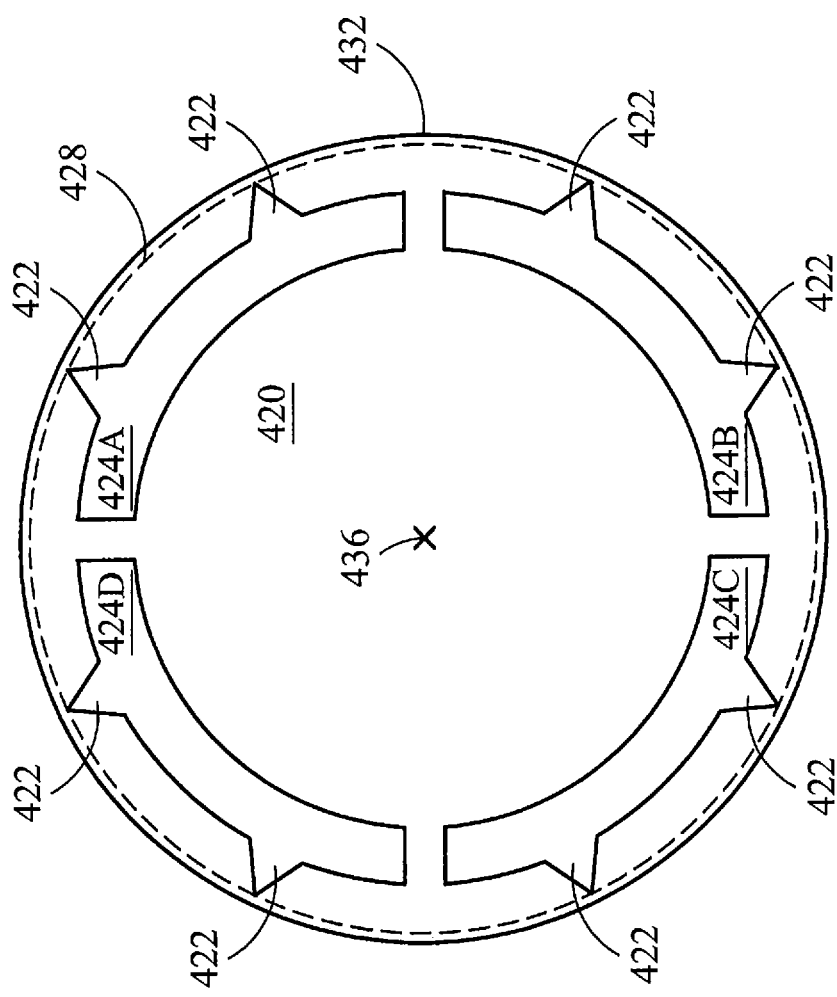
FIG. 4B is a plan view of a monitoring chuck with multiple tips on quadrant based grooves, in accordance with some embodiments.

FIG. 4B is a plan view of a monitoring chuck 420 with multiple tips 422 on quadrant based grooves 424A, 424B, 424C, 424D, in accordance with some embodiments. The quadrant based grooves 424A, 424B, 424C, 424D with multiple tips 422 may be utilized to determine whether a wafer (not illustrated) resting on the monitoring chuck 420 along a wafer position 428 is offset from the wafer position 428. The wafer position 428 is illustrated with dotted lines overlaying the monitoring chuck 420. As noted above, the wafer position 408 may be a nominal position for the wafer to rest on the monitoring chuck 402. As illustrated, the wafer position 408 may be along a circumference along the vertex of each of the multiple tips 422. In certain embodiments, the wafer position 428 may be a predetermined setting for placement of the wafer by a robot. In various embodiments, the wafer position 428 may be physically indicated (e.g., via a physical line or other indicator on the monitoring chuck 420) for ease of identification of the wafer position 428 in a visual inspection.

A wafer offset from the wafer position 428 may correspond to an amount of exposure of the quadrant based grooves 424A, 424B, 424C, 424D. The amount of exposure of the quadrant based grooves 424A, 424B, 424C, 424D may be directly related to an amount of gas released from the grooves 424A, 424B, 424C, 424D. Advantageously, the tips 422 may provide a tapered portion, which may vary (e.g., decrease) in area with distance away from the center 436 of the monitoring chuck 420 and/or wafer position 428. Accordingly, the tips 422 may be utilized for a fine determination of a degree of wafer offset in a particular direction. In virtue of the tapering at the tips 422, the degree of wafer offset may increase as the wafer is offset along the tapered portion of a groove. Also, the number, location, and structure of the tips may be modified to provide different profiles of gas released based on different types of wafer offset. For example, two tips may provide more gas release for a same offset when compared with a single tip. The amount of gas released from the grooves 424A, 424B, 424C, 424D may be monitored by a flow monitor (not illustrated). The flow monitor may produce sensor data that may be analyzed to characterize the wafer offset.

Figure 4C:
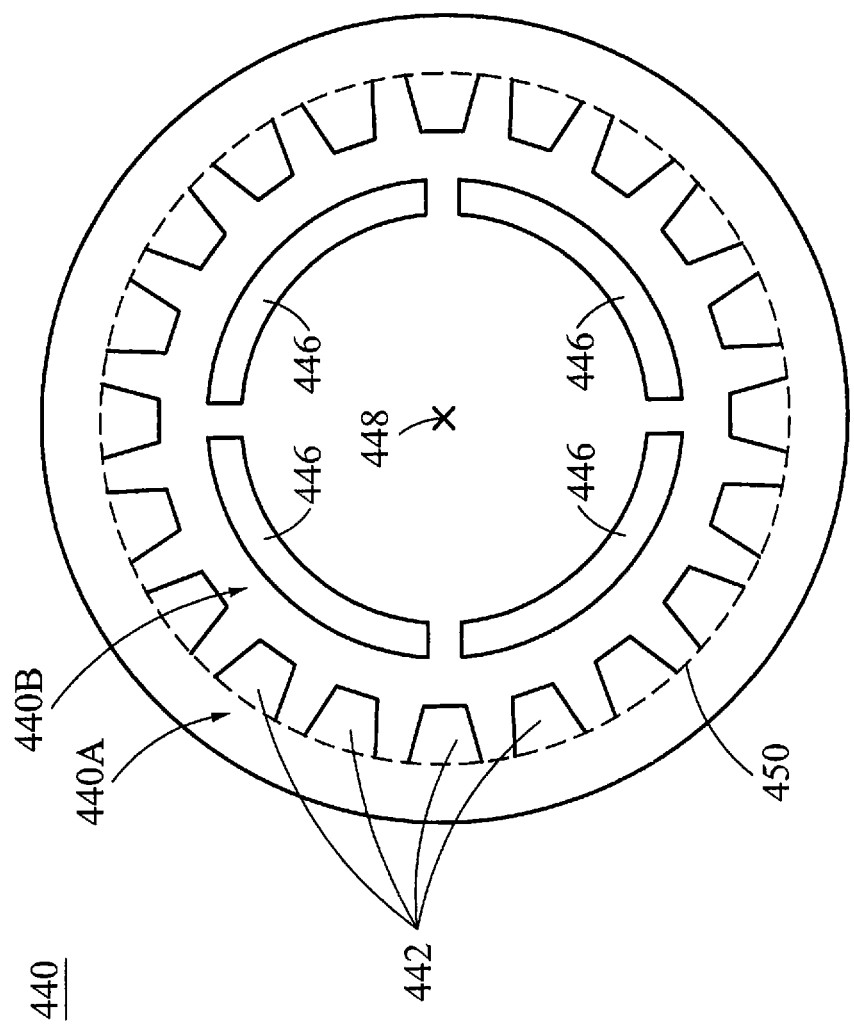
FIG. 4C is a plan view of a two ring monitoring chuck with an outer ring of granular grooves and an inner ring of quadrant based grooves, in accordance with some embodiments.

FIG. 4C is a plan view of a two ring monitoring chuck 440 with an outer ring 440A of granular grooves 442 and an inner ring 440B of quadrant based grooves 446, in accordance with some embodiments. The granular grooves 442 may each be substantially uniform and occupy a different angular (e.g., radial) position around the center 448 of the monitoring chuck 440 and/or wafer position 450. The center 448 of the monitoring chuck 440 and/or wafer position 450 may also be a point in which an axis of rotation for the monitoring chuck may pass through. The inner ring 440B of quadrant based grooves 446 may be laterally surrounded by and concentric with the outer ring 440A of granular grooves 442. The granular grooves 442 may be smaller than the quadrant based grooves 446 and laterally surround and be concentric with the inner ring 440B of quadrant based grooves 446. Accordingly, a wafer offset from a wafer position 428 may be detected at a finer granularity by utilization of the outer ring of granular grooves 442. Also, more significant offsets may be detected with the exposure of the inner ring 440B of quadrant based grooves 446. The granular grooves 442 may include a tapered portion that varies in area with distance away from the center 448. Such a tapered portion may be arranged in a curved line along a greatest distance away from the center of the wafer position. The wafer position 450 is illustrated with dotted lines overlaying the monitoring chuck 440. As illustrated, the wafer position 450 may be along a circumference along the outer edges of each of the multiple granular grooves 442. In certain embodiments, the wafer position 450 may be a predetermined setting for placement of the wafer by a robot. In various embodiments, the wafer position 450 may be physically indicated (e.g., via a physical line or other indicator on the monitoring chuck 440) for ease of identification of the wafer position 450 in a visual inspection.

As noted above, a wafer offset from the wafer position 450 may correspond to an amount of exposure of the outer ring 440A of granular grooves 442 and the inner ring 440B of quadrant based grooves 446. The amount of exposure of the outer ring 460A of triangular groove 462 and the inner ring 460B of quadrant based grooves 466 may be directly related to an amount of gas that may be released from the granular grooves 442 and quadrant based grooves 446. Advantageously, granular grooves 442 may provide a more granular determination of wafer offset in a particular direction (e.g., in a particular angular or radial orientation relative to the center 448). Also, the number, location, and structure of the granular grooves 442 may be modified to provide different profiles of gas released based on different types of wafer offset. The amount of gas released from the granular grooves 442 and quadrant based grooves 446 per unit time may be monitored by a flow monitor (not illustrated). The flow monitor may produce sensor data that may be analyzed to characterize the wafer offset.

Figure 4D:
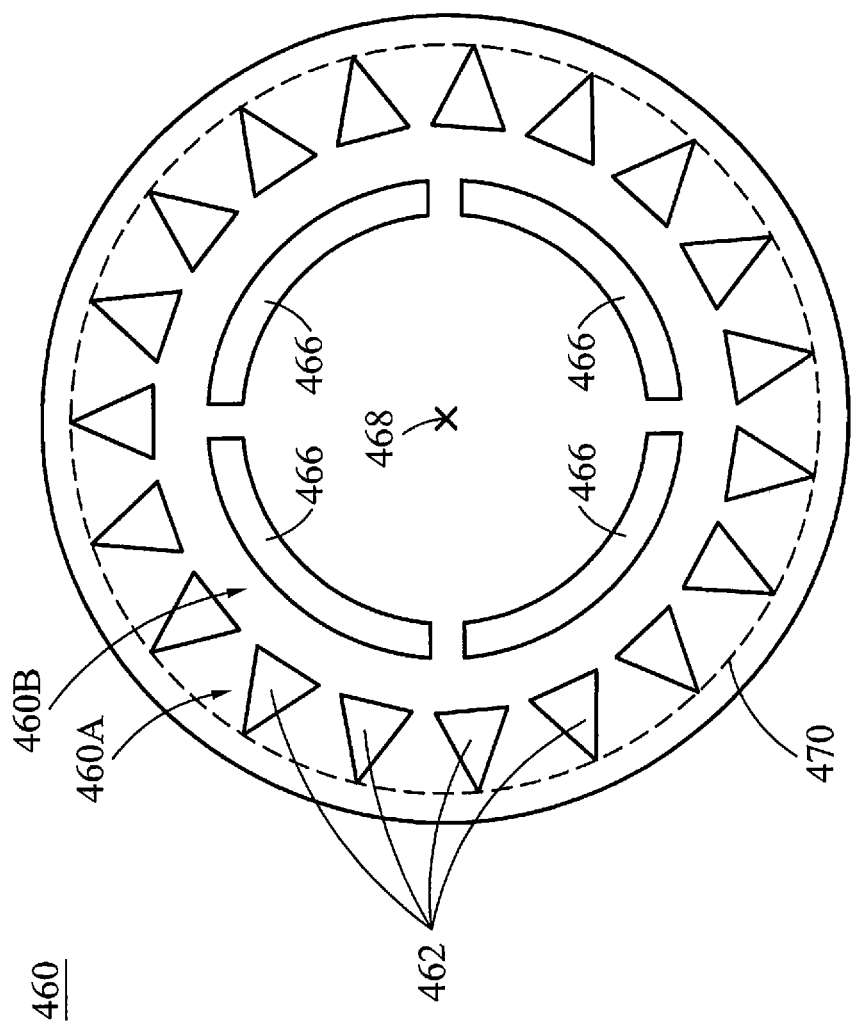
FIG. 4D is a plan view of a two ring monitoring chuck with an outer ring of triangular grooves, in accordance with some embodiments.

FIG. 4D is a plan view of a two ring monitoring chuck 460 with an outer ring 460A of triangular grooves 462 and an inner ring 440B of quadrant based grooves 464, in accordance with some embodiments. The triangular grooves 462 (e.g., grooves of a triangular shape) may each be substantially uniform and occupy a different radial (e.g., angular) position around the center 468 of the monitoring chuck 460 and/or wafer position 470. The center 468 of the monitoring chuck 460 may also be a point in which an axis of rotation for the monitoring chuck may pass through. The inner ring 460B of quadrant based grooves 466 may be laterally surrounded by and concentric with the outer ring 460A of triangular grooves 462. The triangular grooves 462 may be smaller than the quadrant based grooves 466 and laterally surround and be concentric with the inner ring 460B of quadrant based grooves 466. Accordingly, a wafer offset from a wafer position 470 may be detected at a finer granularity by utilization of the outer ring of triangular grooves 462. Also, more significant offsets may be detected with the exposure of the inner ring 460B of quadrant based grooves 466. The triangular grooves 462 may include a tapered portion that varies in area with distance away from the center 448. Such a tapered portion may be arranged to end at a point (e.g., a vertex of a triangle) at a greatest distance away from the center 468. The wafer position 470 is illustrated with dotted lines overlaying the monitoring chuck 460. As illustrated, the wafer position 460 may be along a circumference along the outer edges of each of the multiple triangular grooves 462. In certain embodiments, the wafer position 470 may be a predetermined setting for placement of the wafer by a robot. In various embodiments, the wafer position 470 may be physically indicated (e.g., via a physical line or other indicator on the monitoring chuck 460) for ease of identification of the wafer position 470 in a visual inspection.

As noted above, a wafer offset from the wafer position 460 may correspond to an amount of exposure of the outer ring 460A of triangular grooves 462 and the inner ring 460B of quadrant based grooves 466. The amount of exposure may be directly related to an amount of gas that may be released from the triangular grooves 462 and quadrant based grooves 466. Advantageously, the triangular grooves 462 may provide a more granular determination of wafer offset in a particular direction (e.g., in a particular angular or radial orientation relative to the center 468). Also, the number, location, and structure of the triangular grooves 462 may be modified to provide different profiles of gas released based on different types of wafer offset. The amount of gas released from the triangular grooves 462 and quadrant based grooves 466 may be monitored by a flow monitor (not illustrated). The flow monitor may produce sensor data that may be analyzed to characterize the wafer offset.

Figure 5:
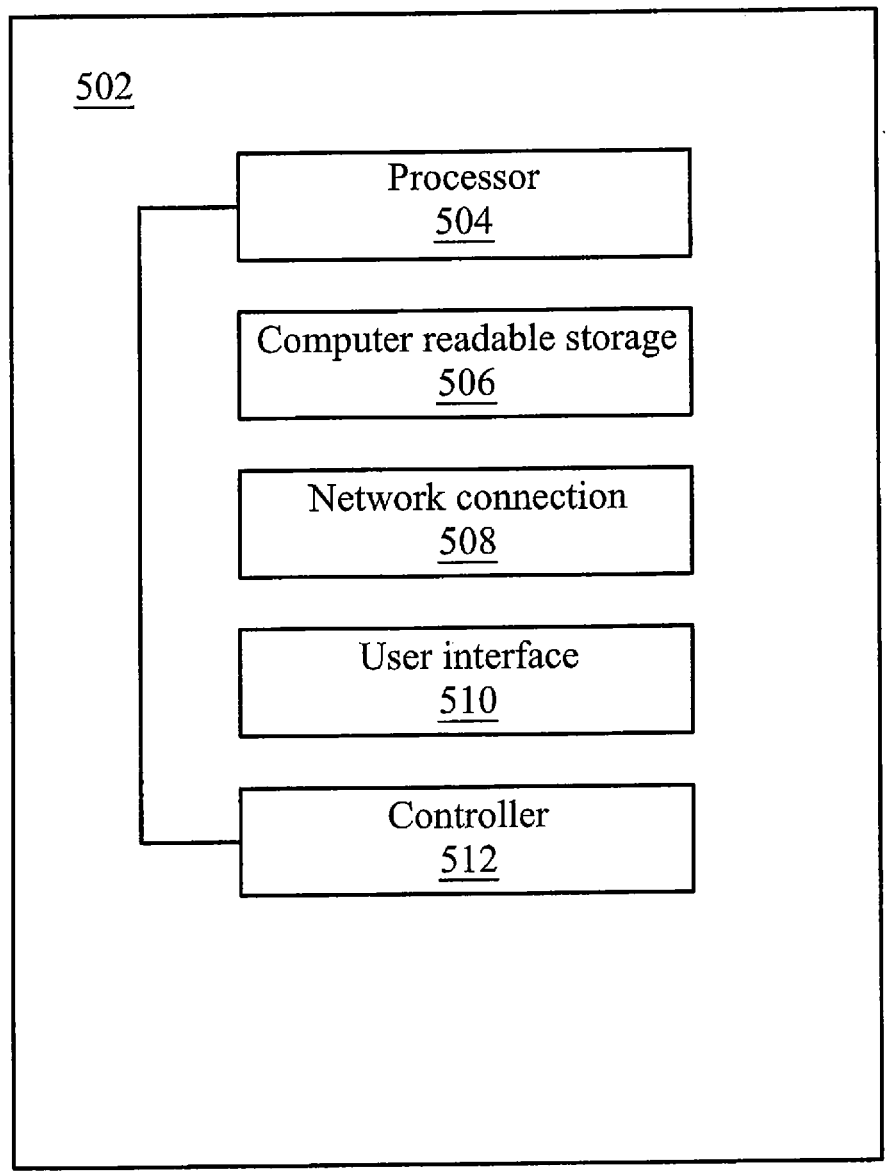
FIG. 5 is a block diagram of various functional modules of a monitoring chuck system, in accordance with some embodiment.

FIG. 5 is a block diagram of various functional modules of a monitoring chuck system 502, in accordance with some embodiment. These functional modules may be present in addition to the various features of the monitoring chuck system discussed above. The monitoring chuck system 502 may include a processor 504. In further embodiments, the processor 504 may be implemented as one or more processors.

The processor 504 may be operatively connected to a computer readable storage 506 (e.g., a memory and/or data store), a network connection 508, a user interface 510, and a controller 512. In some embodiments, the computer readable storage 506 may include process logic that may configure the processor 504 to perform the various processes discussed herein. The computer readable storage may also store data, such as identifiers for a wafer, identifiers for an monitoring chuck, identifiers for a groove, identifiers for a pump, identifiers for a valve, identifiers for a robot, identifiers for a gas of the gas source, identifiers for a gas source, threshold values for a threshold event, and/or identifiers for a type of remediation, and any other parameter or information that may be utilized to perform the various processes discussed herein.

The network connection 508 may facilitate a network connection of the workstation with various devices and/or components of the workstation that may communicate within or external to the monitoring chuck system 502. In certain embodiments, the network connection 508 may facilitate a physical connection, such as a line or a bus. In other embodiments, the network connection 508 may facilitate a wireless connection, such as over a wireless local area network (WLAN) by using a transmitter, receiver, and/or transceiver. For example, the network connection module 508 may facilitate a wireless or wired connection with the processor 504 and the controller 512.

The monitoring chuck system 502 may also include a user interface 510. The user interface may include any type of interface for input and/or output to an operator of the workstation, including, but not limited to, a monitor, a laptop computer, a tablet, or a mobile device, etc.

The monitoring chuck system 502 may include a controller 512. The controller 512 may be configured to control various physical apparatuses that control movement or functionality of the monitoring chuck system 502, such as for an actuator, a cylinder, a nozzle, a robot, and/or a monitoring chuck. For example, the controller 512 may control a motor that may move an actuator, a cylinder, a nozzle, robot, and/or a monitoring chuck. The controller may be controlled by the processor and may carry out the various aspects of the various processes discussed herein.

Figure 6:
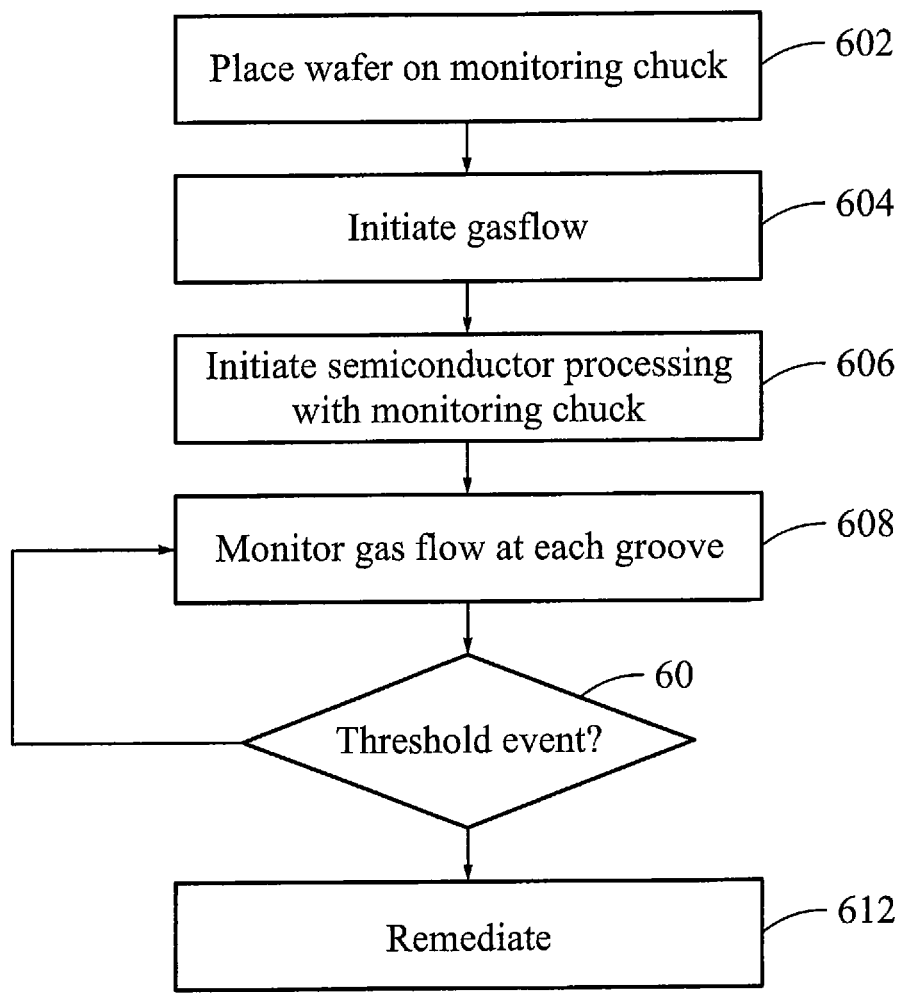
FIG. 6 is a flow chart of a monitoring chuck process, in accordance with some embodiments.

FIG. 6 is a flow chart of a monitoring chuck process 600, in accordance with some embodiments. The monitoring chuck process 600 may be performed by a monitoring chuck system, as introduced above. It is noted that the process 600 is merely an example, and is not intended to limit the present disclosure. Accordingly, it is understood that additional operations may be provided before, during, and after the process 600 of FIG. 6, certain operations may be omitted, certain operations may be performed concurrently with other operations, and that some other operations may only be briefly described herein.

At operation 602, a wafer may be put on a monitoring chuck. The wafer may be placed on the monitoring chuck using a robot which manipulates (e.g., grips) the wafer. The wafer may be brought into the monitoring chuck system (e.g., where the monitoring chuck is located) by being brought from outside a semiconductor processing chamber housing through a portal (e.g., a slit valve that interfaces between the inside and outside of the semiconductor processing chamber) and finally onto the monitoring chuck. In certain embodiments, pins may be extended from the monitoring chuck to receive the wafer on the robot and to bring the wafer on the monitoring chuck. In other embodiments, the robot may directly place the wafer on the monitoring chuck. In any event, the wafer may be brought to rest on the monitoring chuck within a wafer position, which is a nominal position for the wafer on the monitoring chuck. The wafer position may have the wafer generally cover the various contours on the monitoring chuck. In certain embodiments, the wafer position may align with an edge of at least one contour, such that a wafer shift from the wafer position would result in exposing the contour.

At operation 604, gas flow may be initiated from a gas source. Within each contour, gas may be brought from a gas source and the flow of gas monitored via a flow monitor. The source of gas may be individual for each contour or may be shared among contours. Also, the gas may be the same type of gas at each contour or may be different among different contours. The gas may be utilized for wafer cooling, such as by cooling a wafer's backside exposed to the gas flow by covering the contour. In certain embodiments, the gas is helium gas, although other gases may be utilized as desired in different embodiments. For example, the gas may be argon gas in other embodiments or other non-reactive gases to the semiconductor processing being performed on the wafer.

At operation 606, semiconductor processing may be initiated using the monitoring chuck. Example processes that may be performed using (e.g., above) the monitoring chuck include processes related to physical vapor deposition (PVD), chemical vapor deposition (CVD), chemical mechanical planarization (CMP), diffusion (DIF), wet etching, dry etching, photolithography, wet cleaning, dry cleaning, and plasma etching.

At operation 608, gas flow at each groove of the monitoring chuck may be monitored. As noted above, within each contour, gas may be brought from a gas source and the flow of gas monitored via a flow monitor. The flow monitor may produce sensor data that may be analyzed to determine whether a threshold event has occurred (e.g., whether the flow of gas in one or more contours exceeds a threshold value) for remediation. For example, the flow monitor may collect sensor data at each conduit to determine whether there is an offset based on an increase in a flow of gas at that conduit. As noted above, certain conduits may be directional in that they have a different orientation relative to the center of the monitoring chuck and/or wafer when at the wafer position. Therefore a relative increase in gas flow at certain conduits may be indicative of a conduit being uncovered and a wafer offset from the wafer position.

At operation 610, a decision may be made as to whether a threshold event has occurred. In certain embodiments, a threshold event may be when sensor data for a particular conduit exceeds a threshold, or when a set of sensor data for a set of conduits exceeds a threshold. For example, the flow of gas from a conduit may have a nominal range. However, a threshold event may have occurred when that nominal range is exceeded (e.g., when a threshold is passed). The threshold event may occur when a reading of sensor data exceeds a particular threshold value (e.g., an absolute or relative value) associated with the different contours. For example, a threshold event may occur when the sensor data from the flow monitors indicate that gas flow in certain contours in certain directions (e.g., an upper contour) has exceeded a threshold value. This may indicate that a wafer has shifted from a wafer position by uncovering the certain contours (e.g., such as the upper contour). Also, the amount of gas flow may be indicative of an amount of offset for a wafer, or an amount by which a contour is uncovered. In certain embodiments, an aggregate amount of sensor data of may be analyzed to determine detection of an outlier from the aggregated data. Such outliers may be utilized to determine a threshold event. These outliers may be determined in accordance with conventional statistical analysis for outliers. If the threshold event has occurred, the process 600 may proceed to operation 612. If the threshold event has not occurred, the process 600 may proceed to operation 608.

At operation 612, remediation may be performed based on the threshold event. This remediation may include using the robot to manipulate the wafer by placing the wafer back in the wafer position. In certain embodiments, other operations within the monitoring chuck system may be paused pending this remediation. However, in other embodiments, operations within the monitoring chuck system may continue as usual while such remediation is being performed.

In particular embodiments, the type of remediation may be based on the type of threshold event that has occurred. For example, as noted above, a threshold event may occur when the sensor data from the flow monitors indicate that gas flow in certain contours in certain directions (e.g., an upper contour) has exceeded a threshold value. This may indicate that a wafer has shifted from a wafer position by uncovering the certain contours (e.g., such as the upper contour). Also, the amount of gas flow may be indicative of an amount of offset for a wafer, or an amount by which a contour is uncovered. Accordingly, remediation may be performed by having a robot reorient the wafer back to the wafer position by adjusting the wafer in accordance to a direction indicated by the gas flow sensor data and do a degree (e.g., displacement) as indicated by the amount of gas flow.

In an embodiment, a system includes: a chuck; multiple groove conduits arranged around a circumference of a wafer position on the chuck; a gas source in fluid communication with the multiple groove conduits; and a flow monitor configured to determine an amount of gas flow from the gas source to an individual one of the multiple groove conduits.

In another embodiment, a system includes: a chuck; multiple groove conduits arranged around a circumference of a wafer position on the chuck, wherein each groove conduit comprises a tapered portion that decreases in area with distance away from a center of the wafer position; a gas source in fluid communication with the multiple groove conduits; and a flow monitor configured to determine an amount of gas flow from the gas source to an individual one of the multiple groove conduits.

In another embodiment, a method includes: placing a wafer on a chuck at a wafer position, wherein the chuck comprises: multiple groove conduits arranged around a circumference of the wafer position on the chuck, and a gas source in fluid communication with the multiple groove conduits; determining a wafer offset based on an amount of gas flow from the gas source to an individual one of the multiple groove conduits; and moving the wafer on the chuck based on the wafer offset.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
   a chuck;
   multiple groove conduits arranged around a circumference of the chuck and configured to measure an offset of a wafer from an edge of the chuck when the wafer is placed on the chuck, wherein each groove conduit comprises a tapered portion; and
   a flow monitor configured to determine an amount of gas flow from a gas source to an individual one of the multiple groove conduits.

2. The system of claim 1, wherein each tapered portion is arranged in a curved line along a greatest distance away from a center of the wafer position.

3. The system of claim 1, wherein the multiple groove conduits are arranged as two concentric rings, each ring comprising at least two groove conduits.

4. The system of claim 3, wherein one of the two concentric rings comprises more groove conduits than the other.

5. The system of claim 1, wherein the multiple groove conduits are arranged with an outer ring and an inner ring, wherein the outer ring is concentric with the inner ring and comprises more groove conduits than the inner ring.

6. The system of claim 1, wherein the multiple groove conduits comprise a triangular shape.

7. The system of claim 1, wherein the multiple groove conduits comprise at least four groove conduits in ring shape.

8. A system, comprising:
   a chuck;
   multiple groove conduits arranged around a circumference of the chuck so as to measure an offset of a wafer from an edge of the chuck when the wafer is placed on the chuck, wherein each groove conduit comprises a tapered portion;
   multiple gas sources in fluid communication with a respective one of the multiple groove conduits; and
   multiple flow monitors configured to determine an amount of gas flow from a respective one of the multiple gas sources to an individual one of the multiple groove conduits.

9. The system of claim 8, wherein edges of the multiple groove conduits align with the wafer position.

10. The system of claim 8, wherein each tapered portion varies in area with distance away from a center of the wafer position.

11. The system of claim 10, wherein the chuck is an electrostatic chuck.

12. The system of claim 10, wherein each tapered portion ends in a point at a greatest distance from the center of the wafer position.

13. The system of claim 9, wherein each of the multiple gas sources comprises at least one of a helium gas and an argon gas.

14. A method, comprising:
    placing a wafer on a chuck, wherein the chuck comprises multiple groove conduits arranged around a circumference of the chuck so as to measure an offset of the wafer from an edge of the chuck when the wafer is placed on the chuck, wherein each groove conduit comprises a tapered portion;
    determining the offset based on an amount of gas flow from a gas source to an individual one of the multiple groove conduits; and
    aligning the wafer on the chuck based on respective edges of the multiple groove conduits.

15. The method of claim 14, further comprising:
    determining the wafer offset based on an aggregate amount of gas flow from the gas source to multiple ones of the multiple groove conduits.

16. The method of claim 14, further comprising:
    determining the wafer offset based on a rate of gas flow from the gas source to the individual one of the multiple groove conduits.

17. The method of claim 14, further comprising moving the wafer on the chuck using a robot.

18. The method of claim 14, further comprising:
    producing aggregated sensor data by aggregating sensor data produced by a flow monitor;
    determining a threshold value based on the aggregated sensor data; and
    determining the wafer offset based on the threshold value.

19. The method of claim 14, further comprising cooling a backside of the wafer by the gas flow.

20. The method of claim 14, wherein the gas flow comprising a helium gas flow.

* * * * *